United States Patent [19]
de Gouy et al.

[11] Patent Number: 6,107,843
[45] Date of Patent: Aug. 22, 2000

[54] FRACTIONAL PHASE-LOCKED LOOP COHERENT FREQUENCY SYNTHESIZER

[75] Inventors: Jean-Luc de Gouy, Briis sous Forges; Pascal Gabet, Chaville, both of France

[73] Assignee: Thomson-CSF, Paris, France

[21] Appl. No.: 09/070,157

[22] Filed: Apr. 30, 1998

[30] Foreign Application Priority Data

May 7, 1997 [FR] France ................................. 97 05625

[51] Int. Cl.[7] .................................................. H03D 3/24
[52] U.S. Cl. .......................... 327/105; 331/25; 331/1 A; 327/156; 375/376; 377/48
[58] Field of Search .................... 327/105, 156, 327/159, 160, 151, 147, 150; 377/48; 375/376; 331/1 A, 14, 25

[56] References Cited

U.S. PATENT DOCUMENTS

| | | | |
|---|---|---|---|
| 4,468,632 | 8/1984 | Crowley | 331/14 |
| 5,018,170 | 5/1991 | Wilson | 375/120 |
| 5,224,132 | 6/1993 | Golberg | 331/1 A |

FOREIGN PATENT DOCUMENTS

| | | |
|---|---|---|
| 0 218 508 | 4/1987 | European Pat. Off. . |
| 0 557 799 | 9/1993 | European Pat. Off. . |
| 2 426 358 | 12/1979 | France . |

*Primary Examiner*—Dinh Le
*Attorney, Agent, or Firm*—Oblon, Spivak, McClelland, Maier & Neustadt, P.C.

[57] ABSTRACT

Present-day single or multiple fractional phase-locked loop frequency synthesizers are not phase coherent for they use a digital accumulator modulo a number P with a variable increment K, whose state is a function of the history of the change in values that have been imposed on the increment. This lack of phase coherence rules out the use of these synthesizers in certain fields such as that of Doppler radars. A novel type of single or multiple fractional phase-locked loop frequency synthesizer that is coherent in phase is proposed herein. This type of synthesizer comprises one or more counters with an increment of one, having their rate set by the reference oscillator of the synthesizer and being used in phase memories to enable changes in the increment or increments following a change in the fractional division ratio at instants that are synchronous with the reference oscillator.

9 Claims, 7 Drawing Sheets

FRACTIONAL PHASE-LOCKED LOOP COHERENT FREQUENCY SYNTHESIZER

BACKGROUND OF THE INVENTION

1. Field of the Invention

The present invention relates to frequency synthesis and more particularly to fractional phase-locked loop frequency synthesizers.

In many fields, it is necessary to generate wave trains at different frequencies while preserving phase coherence between wave trains of the same frequency, i.e. it is necessary to preserve one and the same phase shift with respect to a pilot signal, so that it is possible for example to follow its Doppler history.

A phase-locked loop frequency synthesizer consists of a voltage controlled oscillator that is phase-locked to a reference oscillator by means of a phase-locked loop that compares a sub-harmonic of the output signal from the voltage controlled oscillator, obtained by integer division or fractional division, with the signal of the reference oscillator. The division is done by means of a counter-divider with an integer division ratio that is updated at each overflow. As a result of this, the beginning of a wave train is always synchronized with an overflow of the counter-divider which itself occurs during a cycle of the signal of the reference oscillator. The lack of coherence appears for a fractional division ratio for, in this case, the overflows of the counter-divider occur, in relation to the cycles of the signal of the reference oscillator, with a phase shift that develops over a duration equal to the least common multiple of cycles between the signal of the voltage controlled oscillator and that of the reference oscillator.

2. Description of the Prior Art

Present day fractional phase-locked loop frequency synthesizers use a counter-divider with at least two successive integer ratios of division N and N+1 and a modulo P digital accumulator, with an integer increment K that is smaller than P and adjustable. This digital accumulator, whose rate is set by the output signal of the counter-divider, is used to activate the change-over of the division ratio of this counter-divider from N to N+1 and vice versa. The result thereof is that the beginning of a wave train, which coincides with a change in the increment K used to adjust the fractional division ratio, may occur without distinction, during any unspecified overflow of the counter-divider, at several points in the duration corresponding to the least common multiple of cycles between the two signals, with various values of phase shift. This randomness leads to a lack of coherence between wave trains of the same frequency if, in the meantime, the frequency synthesizer has been subjected to a frequency switch.

The present invention is aimed at obtaining fractional phase-locked loop frequency synthesizers capable of generating coherent signals even after a frequency excursion.

SUMMARY OF THE INVENTION

An object of the invention is a fractional phase-locked loop synthesizer comprising a reference oscillator, a voltage controlled oscillator, a phase-locked loop receiving, at input, the signal of the voltage controlled oscillator and the signal of the reference oscillator and delivering, at output, the voltage command of the voltage controlled oscillator and comprising a phase comparator that is connected, firstly, directly to the output of the reference oscillator and, secondly, to the output of the voltage controlled oscillator by means of a counter-divider with an adjustable integer ratio of division, said counter-divider having at least two successive integer ratios of division, N and N+1, that can be switched from one to the other, and a circuit to control the instantaneous ratio of division applied to the counter-divider, the circuit performing at least one operation of digital accumulation modulo P, with an integer increment K that is adjustable and smaller than P, and changing said instantaneous ratio of division as a function of the overflows of said operation of digital accumulation. This synthesizer has a circuit to control the instantaneous ratio of division applied to the counter-divider, this control circuit comprising at least one modulo P counter, with an increment of one, having its rate set at the frequency of the signal of the reference oscillator and being used in a phase memory to enable changes, at instants synchronous with the reference oscillator, in the value of the increment K of the digital accumulation, following changes in the fractional division ratio while at the same time preserving, for a given frequency, one and the same phase shift with reference to a pilot signal.

According to a preferred embodiment, the fractional phase-locked loop frequency synthesizer has a circuit to control the instantaneous ratio of division of its counter-divider, this control circuit comprising, in addition to the modulo P counter with an increment of one, a modulo P multiplier multiplying the value counted by the modulo P counter having the increment of one with the increment K of the digital accumulation, a comparator comparing the output signal of the modulo P multiplier with the increment K of the operation of digital accumulation and generating an overflow signal whenever it observes that the output signal of the modulo P multiplier is strictly smaller than the value of the increment K of the operation of digital accumulation, and a synchronization means synchronizing the overflow signal of the comparator with the output signal of the counter-divider before applying it to the counter-divider as a command for changing the division ratio.

According to one variant, the comparator comparing the output signal of the modulo P multiplier with the increment K of the digital accumulation generates an overflow signal whenever it observes that the output signal of the modulo P multiplier is greater than or equal to the modulo P minus the increment K of the digital accumulation instead of being strictly smaller than the value of the increment K of the digital accumulation.

According to another embodiment, the fractional phase-locked loop frequency synthesizer has a circuit to control the instantaneous ratio of division of its counter-divider which, in addition to the modulo P counter with an increment of one, comprises a modulo P accumulator, with an increment K, whose rate is set at the frequency of the reference oscillator, a K increment memory, receiving a write command from an overflow output of the modulo P counter with an increment of one and having a data read output, connected to an increment input of the modulo P accumulator with an increment K, and a synchronization means that synchronizes the overflow signal of the accumulator with the output signal of the counter-divider before applying it to the counter-divider as a command for changing the ratio of division.

According to one variant adapted to multiple fractional steps, where the frequency and the size of the changes in the ratio of division of the counter-divider depend on the occurrence of the overflows of different operations of digital accumulation modulo relatively prime integers $P_1, P_2, \ldots, P_s$, with various variable integer increments, these operations of digital accumulation being conducted in parallel at the frequency of the reference oscillator, the circuit for the control of the instantaneous ratio of division of the counter-divider is split up into numerous circuits, each implicitly or explicitly performing one of said digital accumulation operations and generating individual overflow signals added up by a digital summator circuit before being applied to the command for changing the ratio of the counter-divider.

BRIEF DESCRIPTION OF THE DRAWINGS

Other features and advantages of the invention shall emerge from the following description of several embodiments given by way of an example. This description shall be made with reference to the appended drawings, of which.

MORE DETAILED DESCRIPTION

As can be seen in FIG. 1, an integer phase-locked loop frequency synthesizer consists of a voltage controlled oscillator VCO 1, phase-locked with a reference oscillator 2 by means of a phase-lock loop. The phase-lock loop comprises a loop filter 3, a phase-frequency comparator 4 and a counter-divider 5. The loop filter 3 is connected between the voltage control input of the voltage controlled oscillator VCO 1 and the output of a phase-frequency comparator 4. The phase-frequency comparator 4 has two inputs: one input directly connected to the output of the reference oscillator 2 and the other input connected to the output of the voltage controlled oscillator VCO 1 by means of the counter-divider 5.

The voltage controlled oscillator VCO 1 delivers the output signal at the frequency $F_0$ of the frequency synthesizer. The reference oscillator 2 delivers a reference signal at the frequency $F_{ref}$. The counter-divider 5 carries out the division, by an integer ratio N, of the frequency $F_0$ of the signal of the voltage controlled oscillator VCO 1 before submitting the result to the phase-frequency comparator 4 so that the phase-locked loop ensures the following equality between frequencies:

$$F_0 = N \times F_{ref}$$

The least common multiple of cycles between the signal of the voltage controlled oscillator VCO 1 and that of the reference oscillator 2 is equal to one cycle of the reference oscillator.

Figure 1A:
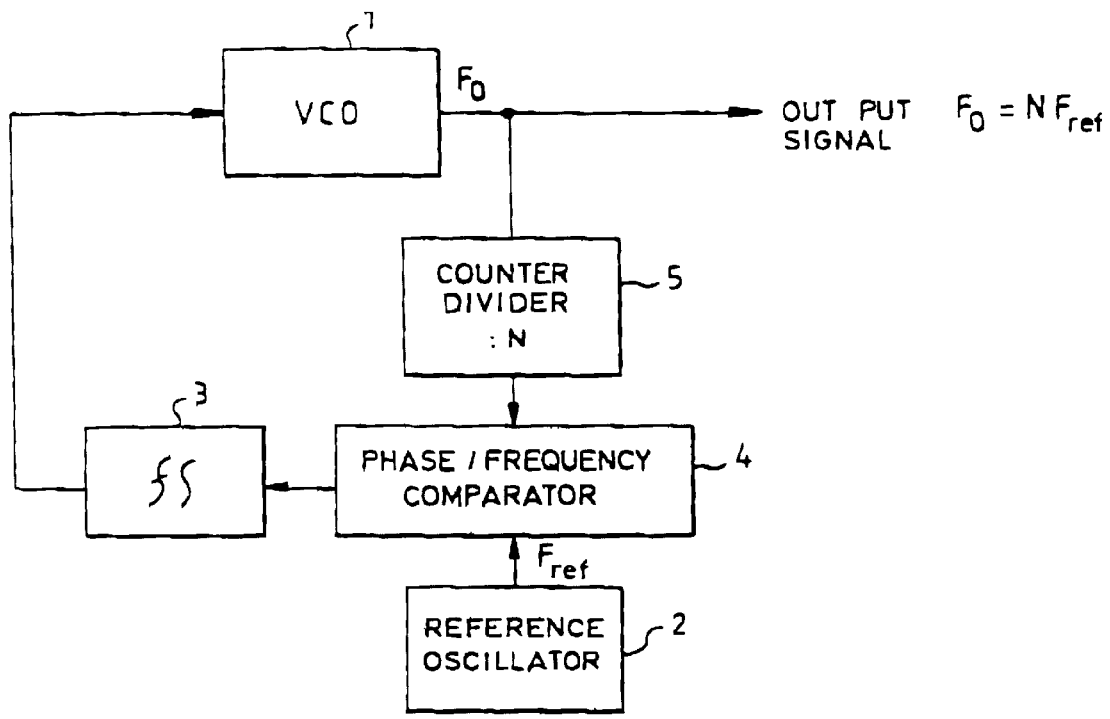
FIG. 1a gives a schematic view of an integer division phase-locked loop frequency synthesizer.
Figure 1B:
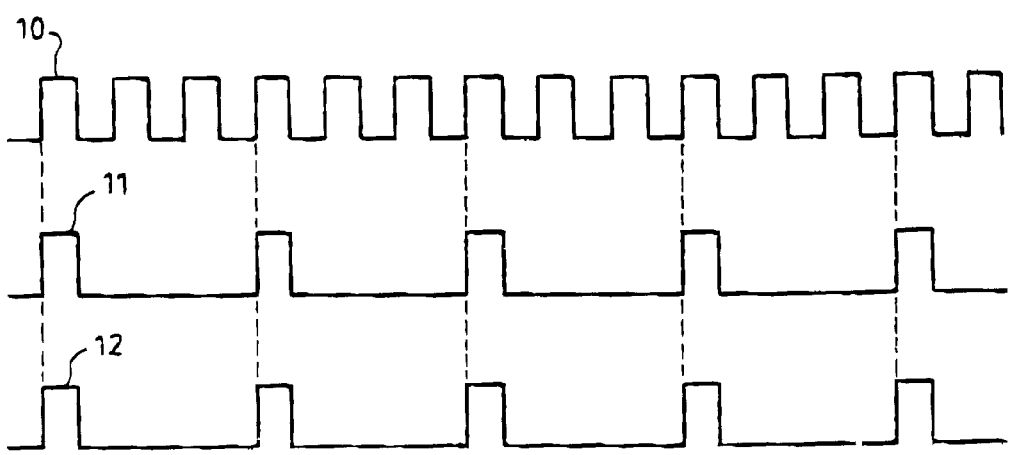
FIG. 1b shows a graph of curves illustrating the operation of the synthesizer represented in FIG. 1a and showing the phase coherence of the wave trains derived therefrom.

FIG. 1b provides a simplified view of the temporal relationships between the different signals that appear at the terminals of the circuits of FIG. 1a. This simplified view does not take account of the constant phase shifts introduced by the phase-frequency comparator 4 and the counter-divider 5, The curve 10 represents the output signal at the frequency $F_0$ of the voltage controlled oscillator VCO 1, the curve 11 represents the output signal of the counter-divider by N referenced 5, N being taken to be equal to three, and the curve 12 represents the signal at the frequency $F_{ref}$ of the reference oscillator 2.

The overflow of the counter-divider 5, which is identified in FIG. 1b by dashes, always occurs at the same instant of a cycle of the signal of the reference oscillator 2. As the starting points of the wave trains coming from the synthesizer coincide with an overflow of the counter-divider 5 since this is the only time when the integer ratio of the counter-divider can be changed, all the wave trains coming from the synthesizer at a given frequency have the same phase at the outset as compared with the signal of the reference oscillator 2, even if the synthesizer has performed frequency excursions between these wave trains. They are therefore naturally coherent.

An integer division phase-locked loop frequency synthesizer naturally generates coherent wave trains. However it has the drawback of having a minimum frequency variation step equal to $F_{ref}$, which is often far too great.

To reduce the minimum frequency variation step of a phase-locked loop frequency synthesizer, there is a known technique called fractional synthesis which makes it possible to obtain a synthesis step equal to a fraction of the frequency of the reference oscillator. Its value is that it improves the frequency resolution of a phase-locked loop synthesizer without causing deterioration in the phase noise.

According to this technique, the fractional division is obtained by dynamically changing the value of the ratio of integer division of the counter-divider of the phase-locked loop between two successive values N and N+1. Thus, to obtain a fractional division ratio equal to N+K/P (K and P being integers and K<P), the counter-divider of the phase-locked loop will perform division by a ratio N during P−K cycles of the reference oscillator and by a ratio N+1 during K cycles of the reference oscillator.

Figure 2A:
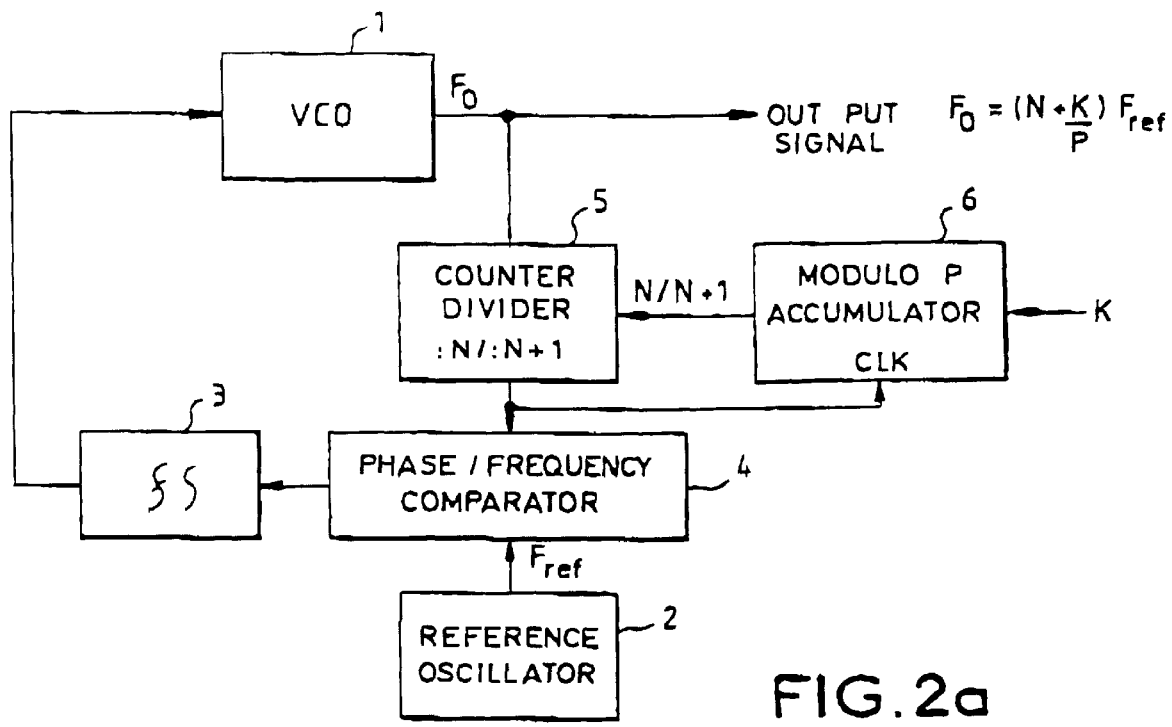
FIG. 2a is a block diagram showing the modification usually made in an integer division phase-locked loop frequency synthesizer to convert it into a fractional synthesizer.

The usual method for obtaining this dynamic change of the division ratio of the counter-divider of the phase-locked loop is to use a modulo P digital accumulator with a K increment working at the frequency of the reference oscillator so that, by its overflows, it activates a control input for switching the division ratio between the values N and N+1. This is what is shown in FIG. 2a where it can be seen that a modulo P digital accumulator 6 with an increment K has been added with its clock input connected to the output of the counter-divider by N referenced 5 and its overflow output connected to a control input for switching over the division ratio of the counter-divider 5 of the phase-locked loop between the values N and N+1.

The counter-divider 5 divides the frequency $F_0$ of the voltage controlled oscillator signal VCO 1 according to a fractional ratio N+K/P before submitting it to the phase comparator 4 so that the phase-locked loop resolves the equation:

$$F_0 = (N+K/P)F_{ref}$$

which can also be written as:

$$PT_{ref} = (NP+K)T_0$$

with:

$$T_{ref} = \frac{1}{F_{ref}} \quad \text{and} \quad T_0 = \frac{1}{F_0}$$

The least common multiple of cycles between the signal of the voltage controlled oscillator VCO 1 and the signal of the reference oscillator is no longer equal to one cycle of the reference oscillator 2 but to P cycles or to a sub-multiple of P cycles if the ratio K/P is not irreducible.

Figure 2B:
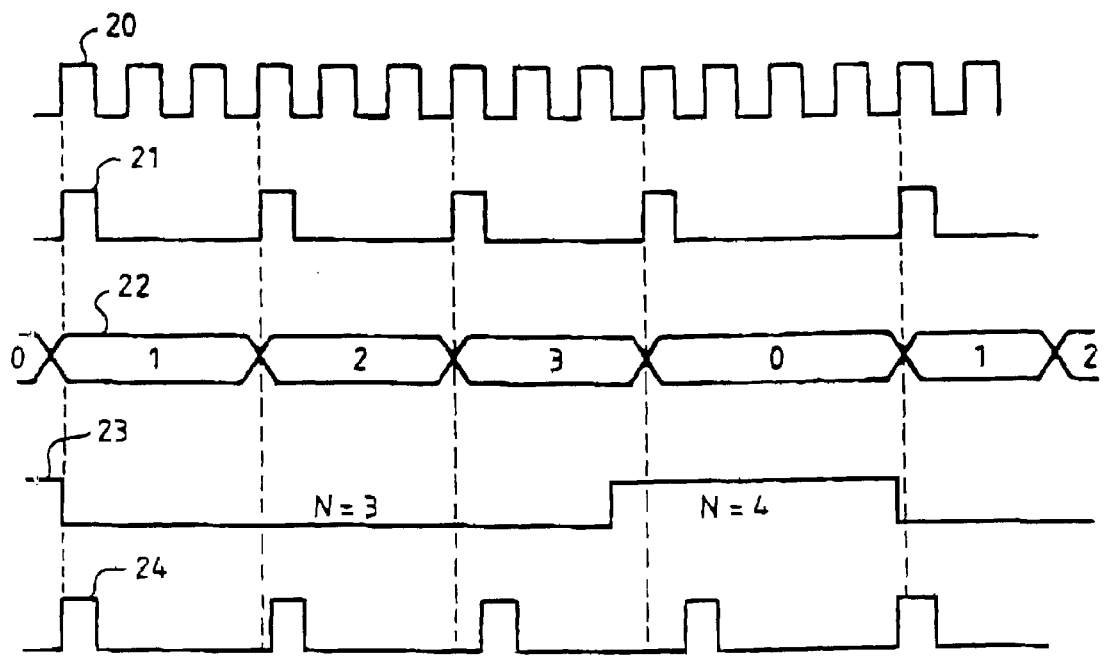
FIG. 2b is a graph of curves illustrating the operation of the fractional synthesizer shown in FIG. 2a and showing why the wave trains derived therefrom are not coherent.

FIG. 2b provides an illustration of the temporal relationships between the different signals appearing at the terminals of the circuits of FIG. 2a. This illustration is again simplified and does not take account of the constant phase shifts introduced by the different circuits, namely the phase-frequency comparator, the counter-divider and the digital accumulator.

The curve 20 represents the output signal at the frequency $F_0$ of the voltage controlled oscillator VCO 1, the curve 21 represents the output signal of the counter-divider by N referenced 5, N being taken to be equal to three, the curve 22 represents the contents of the digital accumulator 6 assuming that P is equal to four and the increment K to one, the curve 23 represents the overflow command and the curve 24 represents the signal at the frequency $F_{ref}$ of the reference oscillator 2.

With this example in which it has been chosen to have N=3, K=1 and P=4, we get:

$$F_0 = \left(N + \frac{K}{P}\right)F_{ref} = \frac{13}{4}F_{ref} = 3,25\ F_{ref}$$

The contents of the digital accumulator 6 change at each output pulse from the counter-divider 5. Let $C_n$ be the contents of the digital accumulator during one cycle of the signal of the reference oscillator 2. Its contents $C_{n+1}$ during the next cycle will be equal to:

$$C_{n+1} = C_n + K = C_n + 1$$

The overflow of the digital accumulator 6 then takes place once every four cycles of the signal of the reference oscillator 2 and prompts a division by four instead of a division by three of the signal at output of the voltage controlled oscillator. Thus, thirteen cycles with a frequency $F_0$ are obtained at output of the voltage controlled oscillator VCO 1 for four cycles with a frequency $F_{ref}$ of the reference oscillator 2, giving a fractional ratio of 3.25.

In this example, the least common multiple of cycles between the signal with a frequency $F_0$ of the voltage controlled oscillator and the signal with a frequency $F_{ref}$ of the reference oscillator is thirteen cycles of the signal of the voltage controlled oscillator for four cycles of the signal of the reference oscillator. An overflow of the counter-divider still appears at each cycle of the reference oscillator 2, but the overflow occurs with a variable delay that depends on the position of the cycle considered of the reference oscillator 2 in a sequence corresponding to the least common multiple of the cycles referred to here above. Here, since the least common multiple of cycles lasts four cycles of the reference oscillator 2, an overflow of the counter-divider 5 can take place for four distinct values of phase shift during a cycle of the reference oscillator 2. Assuming that the synthesizer generates a first wave train at a frequency $F_1$ and then another wave train at a different frequency $F_2$, implying a change in the increment of the digital accumulator, and finally a second wave train at the frequency $F_1$, it is not certain that the second wave train of the frequency $F_1$ will have the same phase reference as the first one. Indeed, the change in frequency of the synthesizer, when it corresponds to a change in the increment of the digital accumulator, occurs during an unspecified overflow of the counter-divider 5, namely with a phase shift that can take any value whatsoever of four distinct values. The two wave trains at the frequency $F_1$ therefore do not necessarily have the same phase shift with respect to the signal of the reference oscillator. This destroys the coherence.

This lack of phase coherence of the prior art fractional phase-locked loop synthesizers is due to the dependency of the present state of their digital accumulator with respect to the history of the different instructed increment values applied beforehand. This lack of phase coherence rules out their use in certain applications, such as, for example those of Doppler radars whereas it would be very valuable to implement them in these applications owing to their spectral purity.

It is proposed to make the fractional phase-locked loop frequency synthesizers coherent by the addition to these synthesizers of a phase memory based on a modulo P counter with an increment of one whose rate of operation is set at the frequency of the reference oscillator. This phase memory is used to take position within a sequence of P consecutive cycles of the reference oscillator, hence with reference to the least common multiple of cycles between the signal of the reference oscillator and the output signal of the synthesizer. It is used to ensure that a change in increment of the digital accumulation occurs always with the same phase shift in relation to this least common multiple of cycle. It has indeed been seen that this common multiple of cycles is equal to P cycles or to a sub-multiple of P cycles of the reference oscillator.

To keep the same phase reference with respect to this least common multiple of cycles between the signal of the voltage controlled oscillator and the signal of the reference oscillator, it is possible to use the phase memory based on a modulo P counter having an increment of one, working at the frequency of the reference oscillator to permit the changes in the increment of the digital accumulation only every P cycles of the reference oscillator. This possibility leads to a first embodiment. However, the fact of permitting changes in increment of digital accumulation only every P cycles of the reference oscillator causes time limits in the generation of the wave trains that may give rise to problems in certain applications. To avoid them, the phase memory based on a modulo P counter having an increment of one, working at the rate of the reference oscillator, can be used to detect the instants of overflow of a operation of digital accumulation that is initiated when the synthesizer starts up: this leads to a second embodiment.

Figure 3:
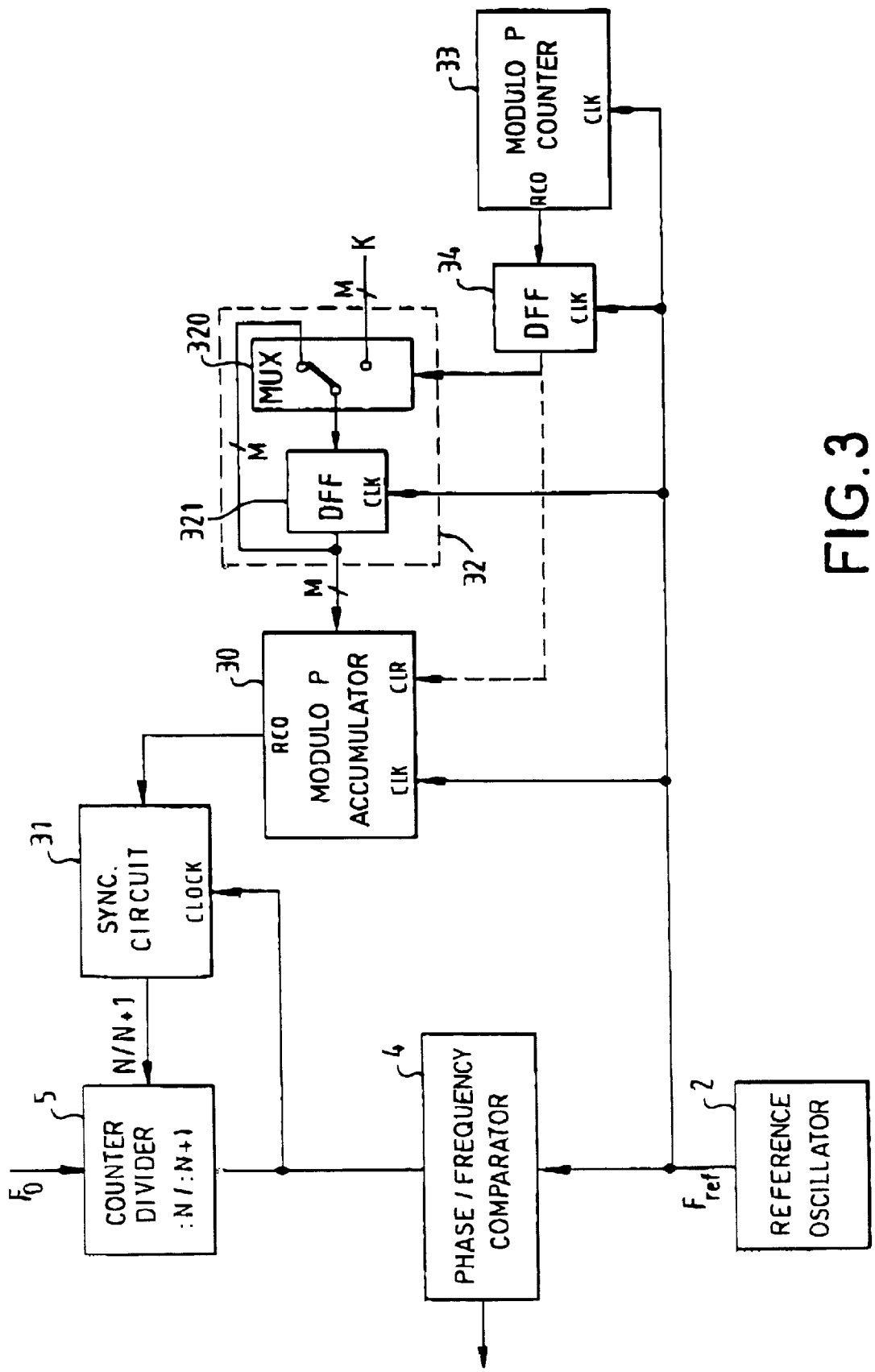
FIG. 3 is a block diagram of a circuit according to the invention used to obtain fractional steps in a phase-locked loop frequency synthesizer while at the same time preserving phase coherence for the wave trains derived therefrom.

FIG. 3 illustrates the first embodiment. With a view to simplification, the voltage controlled oscillator 1 and the loop filter 3 have been omitted but the figure again shows the reference oscillator 2 as well as the counter-divider 5 and the phase-frequency comparator 4 of the phase-lock loop. The counter-divider 5 has two successive integer ratios of division, N and N+1, possible as well as one input to control the switching over between these two ratios. This input to control the changing over of the ratio of division of the counter-divider 5 is piloted, as here above, by an overflow output of a modulo P digital accumulator 30 with an integer increment K that is variable and smaller than P, working at the frequency of the reference oscillator 2. However, this digital accumulator 30 is connected differently. Its rate is no longer set by the output signal of the counter-divider 5 which is at the frequency of the reference oscillator 2 only when the phase-lock loop reaches its equilibrium but by the signal of the reference oscillator 2 itself. To take account of this modification, its overflow output is no longer connected directly to the circuit controlling for the switching of the ratio of the counter-divider 5. Rather, it is connected to this circuit by means of its synchronization circuit 31. The rate of this synchronization circuit is set by the output signal of the counter-divider 5 so that the state of the overflow output of the digital accumulator 30 is sampled at the rate of the overflows of the counter-divider 5.

The increment K input of the modulo P digital accumulator 30 is connected to the output of an increment digital memory 32. The recording of the increment is activated by the overflow signal of a phase memory based on a modulo P counter 33 having an increment of one, the pace of this counter 33 being set by the signal of the reference oscillator 2. The increment digital memory 32 consists, for example, of firstly a multiplexer 320 with two data inputs, one data output and one addressing input and, secondly, a bank of D type logic flip-flop circuits 321. One of the data inputs of the multiplexer 320 is looped to its output by means of the bank of D type logic flip-flop circuits 321 whose rate is set by the signal of the reference oscillator 2. The other data input of the multiplexer 320 receives the set value of the increment K. The addressing input of the multiplexer 320 is connected to an overflow output of the modulo P counter 33 with an increment of one by means of a D type logic flip-flop circuit 34 whose rate is set by the reference oscillator 2. The addressing of the multiplexer 320 is such that, when there is no overflow of the modulo P counter 33 with an increment of one, its data output is looped to itself by means of the bank of D type logic flip-flop circuits 321. Thus, there is obtained an increment memory that is updated solely at each overflow of the modulo P counter 33 with an increment of one that serves as a phase memory and permits a change in increment K for the modulo P digital accumulator 30 only at every P cycles of the reference oscillator 2. This ensures, as we have seen here above, the phase coherence between all the wave trains generated at one and the same frequency by the frequency synthesizer, even if the frequency synthesizer has performed frequency swings between the instants of generation of these wave trains.

As a variant, the output of the D type logic flip-flop circuit 34 can be also connected to a resetting input of the digital accumulator 30, thus synchronizing the points of passage through zero by the digital accumulator 30 with those of the phase memory modulo P counter 33 that has an increment of one. This possibility is recalled in FIG. 3 by a link shown in dashes between the output of the D type logic flip-flop circuit 34 and a resetting input of the modulo P digital accumulator 30.

Figure 4:
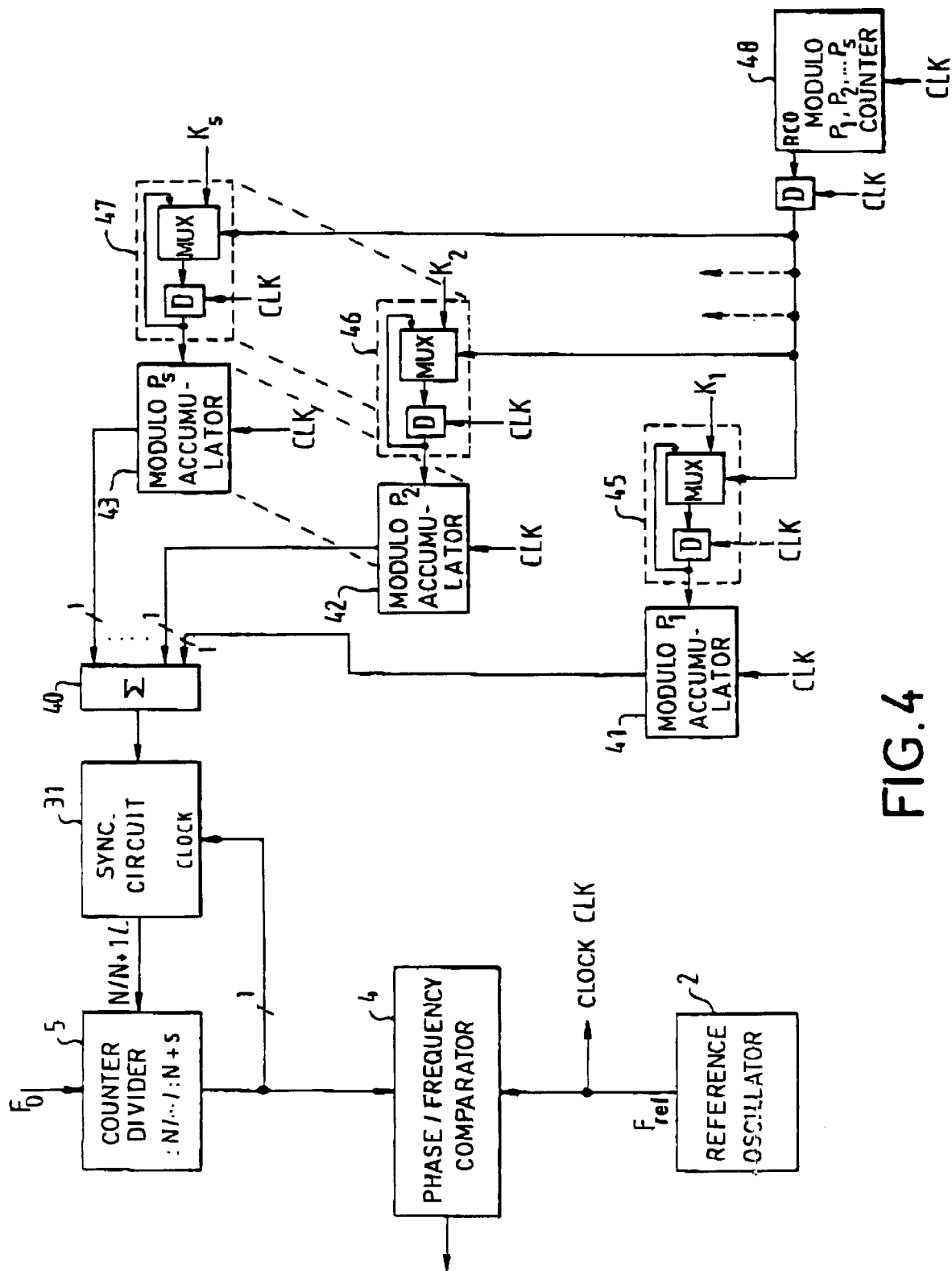
FIG. 4 is an extension of the diagram of the previous figure to a multiple fractional phase-locked loop frequency synthesizer.

FIG. 4 shows an extension of the diagram of FIG. 3 to a multiple fractional phase-locked loop frequency synthesizer. Multiple fractional phase-locked loop synthesizers are differentiated from single fractional phase-locked loop synthesizers by the fact that, in their phase-locked loop, they use a counter-divider with more than two possible successive ratios of integer division: N, N+1, N+2, ■ N+s, for which the command to switch over the division ratio is controlled by the output of a digital adder 40 receiving the overflow commands from s distinct digital accumulators 41, 42, ■, 43, modulo distinct and relatively prime integers $P_1, P_2, \ldots, P_s$, all these accumulators working at the frequency of the reference oscillator 2 with variable integer increments $K_0, K_1, \ldots, K_S$. Each digital accumulator 41, 42, ■, 43 receives its increment $K_0, K_1, \ldots, K_S$ from an individual increment memory 45, 46, ■, 47 that is updated only at each overflow of a counter 48 modulo the product $$\prod_{i=1}^{s} P_i,$$

with an increment of one, that works at the frequency of the reference oscillator 2 and serves as a common phase memory.

With an assembly of this kind, it can be seen that the change in frequency, by a change in increment, is possible only every $$\prod_{i=1}^{s} P_i$$

cycles of the reference oscillator. This may lead to time limits of operation that cause difficulties in applications where it is necessary to change frequency very quickly while preserving coherence. To reduce these switching time limits, the phase memory can be used to maintain coherence by taking reference solely with respect to the instants of overflow of an operation of digital accumulation that is initiated systematically when the synthesizer is started.

Let us take an operation of digital accumulation C modulo P with an unspecified integer increment K that is smaller than P, performed at the rate of the reference oscillator and initiated when the frequency synthesizer is started at the cycle 0 of the reference oscillator:

$C_0=0$

At the nth cycle of the reference oscillator, it will have the value:

$C_n=(n.K) \bmod P$ \hfill (1)

To express it as a function of the contents of the phase memory which is a modulo P counter with an increment of one working at the rate of the reference oscillator, the following term must be made to appear in the previous expression:

$n \bmod P$

To do this, the following is supposed:

$X=n-(n \bmod P)$ \hfill (2)

If, in the relationship (1), n is replaced by its value taken in the relationship (2), we get:

$C_n=(X.K) \bmod P+[(n \bmod P).K] \bmod P$

Since P divides X, we can write:

$$(X.K) \bmod P = 0$$

Whence:

$$C_n = [(n \bmod P).K] \bmod P$$

This latter expression shows that the contents of a digital accumulation with an increment K, performed at the rate of the reference oscillator and initiated when the synthesizer is started is equal to the product modulo P of the increment K by the contents of a phase memory which is itself a modulo P counter with an increment of one working at the rate of the reference oscillator. It is therefore possible, at any point in time, to know the contents of this digital accumulation by multiplying modulo P the increment K by the contents of the phase memory.

With the contents of this digital accumulation initiated when the synthesizer is started being known, it is possible therefrom to deduce the cycles of the reference oscillator during which there is an overflow of these contents. Indeed, if these contents are strictly smaller than the increment K, it means that they have overflowed during the previous cycle of the reference oscillator. If the contents are greater than or equal to the increment K, it means that they have not overflowed during the previous cycle of the reference oscillator. It is therefore observed that the true value and false value respectively of the expression:

$$[(n \bmod P).K] \bmod P < K$$

gives, plus or minus a temporal shift, the value 1 and 0 respectively of the overflow signal of a digital accumulator which would have been initiated when the synthesizer was started. This temporal shift has no importance for the coherence for it is constant.

As a variant, it is also possible to compare the contents of the digital accumulation initiated when the synthesizer is started with the value P−K. Indeed, if the contents of the digital accumulation are greater than or equal to the value P−K, there will be an overflow at the next cycle of the reference oscillator. If not, there will be no overflow.

Figure 5:
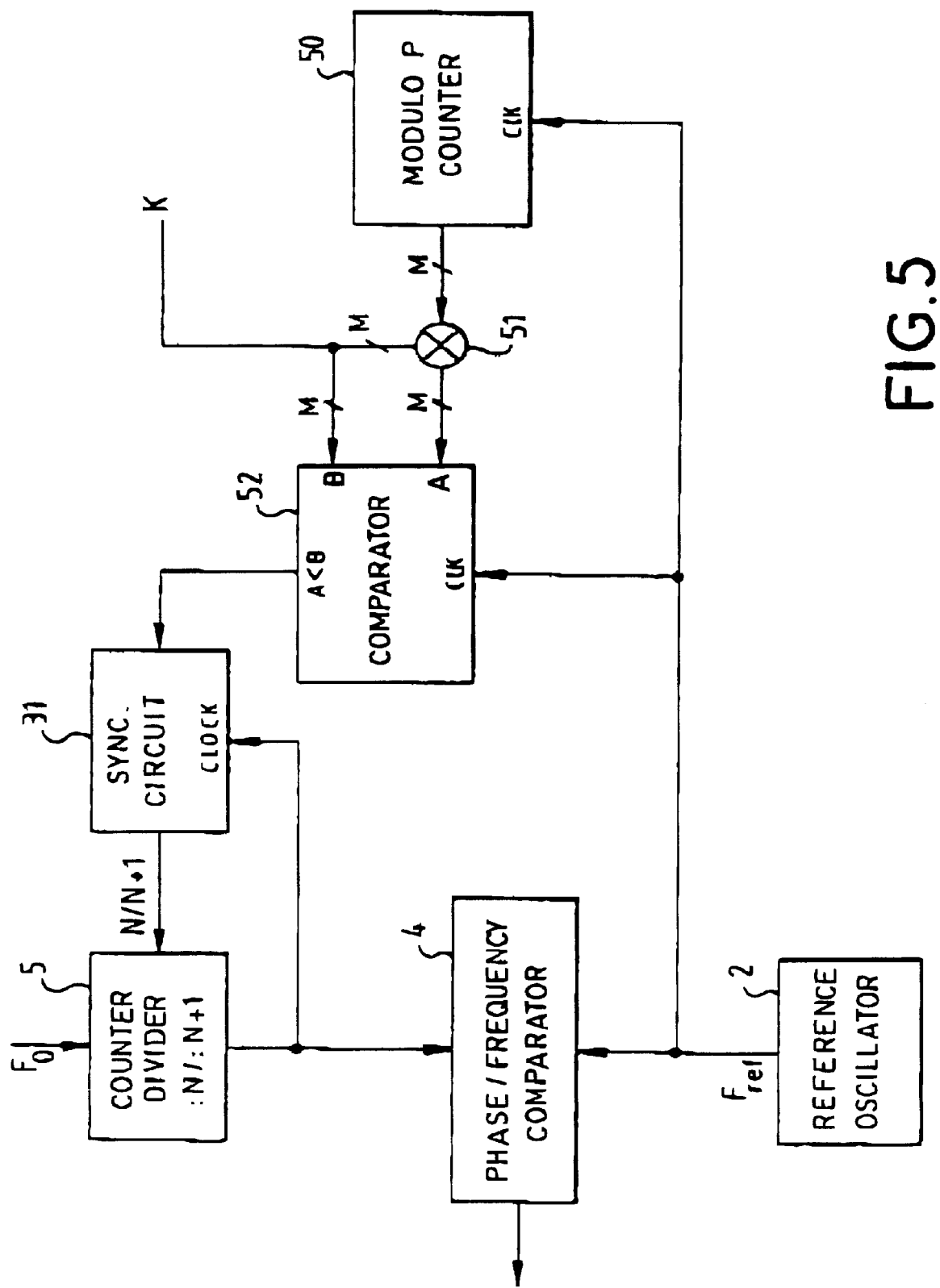
FIG. 5 is a block diagram of another circuit according to the invention that also makes it possible to obtain fractional steps in a phase-locked loop frequency synthesizer while at the same time preserving the phase coherence for the wave trains derived therefrom.

FIG. 5 shows a diagram of the coherent fractional phase-locked loop frequency synthesizer based on an implicit computation of the overflows of an operation of digital accumulation modulo P with an integer increment K, performed at the rate of the reference oscillator and initiated when the synthesizer is started up. As in FIG. 3, the voltage controlled oscillator 1 and the loop filter 3 have been omitted but the reference oscillator 2 as well as the counter-divider 5 and the phase-frequency comparator 4 of the phase-locked loop are shown again. The counter-divider 5 still has two possible successive ratios of integer division N and N+1 and one control input for switching over between these two ratios connected to the output of a synchronization circuit 31 whose rate is set by the output signal of the counter-divider 5. This synchronization circuit 31 samples the state of a signal to control the switching between the successive ratios of division N and N+1 at the rate of the overflows of the counter-divider 5.

The signal for switching over between the successive ratios of division N and N+1 applied to the input of the synchronization circuit 31 comes from a circuit to control the instantaneous ratio of division. This control circuit implicitly computes a digital accumulation modulo P with an increment K initiated when the synthesizer is started and detects the cycles of the reference oscillator 2 during which this digital accumulation overflows. This control circuit consists of a modulo P counter 50 with an increment of one having its rate set by the reference oscillator 2, a modulo P digital multiplier 51 with two data inputs and one digital comparator 52 with two parallel data inputs A and B, one clock input and one comparison output A<B.

At one of its inputs, the multiplier 51 receives the count of the modulo P counter 50 and at the other input it receives the digital value of the increment K of the accumulation. At output, it is connected to the data input A of the digital comparator 52. At its other data input B, the digital comparator 52 receives the digital value of the increment K of the accumulation while its clock input is connected to the output of the reference oscillator 2 and while its comparison output A<B constitutes that of the control circuit.

The modulo P counter 50 with increment of one, whose rate is set by the reference oscillator 2, constitutes a phase memory. It gives a count n mod P of the cycles of the reference oscillator from the time of starting of the synthesizer. The modulo P multiplier 51 delivers the product modulo P of this count multiplied by the value of the increment K of the accumulation:

$$[(n \bmod P).K] \bmod P$$

namely, as we have just seen, the value of the digital accumulation, modulo P and increment K, performed at the rate of the reference oscillator 2 from the starting of the synthesizer, whatever the history of the changes in value of the increment K. The comparator 52, by the implementation of the relationship:

$$[(n \bmod P).K] \bmod P < K$$

detects the cycles of the signal of the reference oscillator 2 at which this digital accumulation overflows. It performs this detection with a constant delay of one cycle of the reference oscillator which is of no importance since it is constant. Then, these operations of detection are used after the resynchronization on the overflows of the counter-divider 5 to temporarily switch the division ratio of the counter-divider 5 over to the value N+1 and obtain the desired fractional step. Since the digital accumulation considered always begins with the starting of the synthesizer, all the wave trains of the same frequency that are generated by the synthesizer during its operation are coherent in phase, whatever the history of the changes in value of the increment K.

Figure 6:
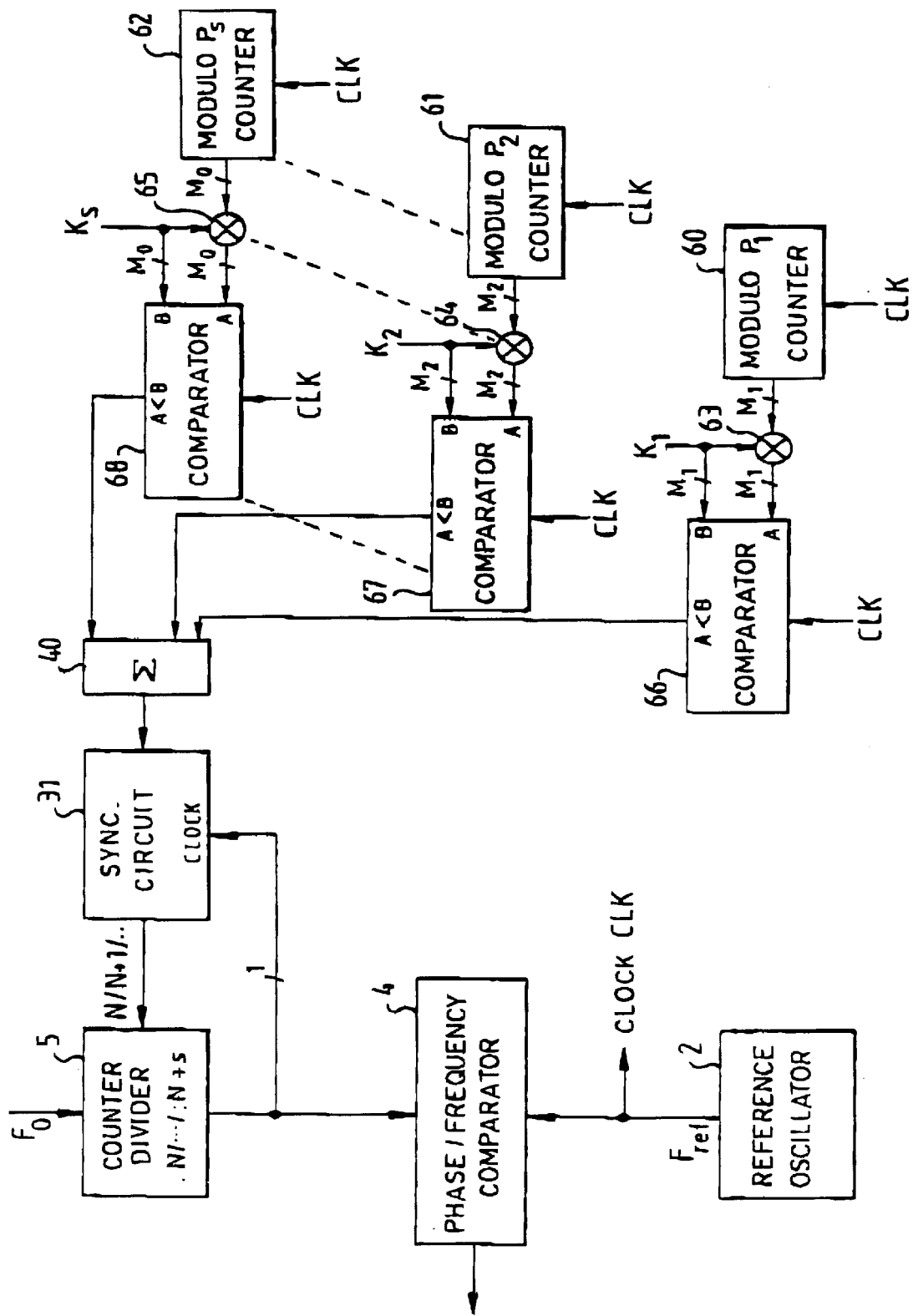
FIG. 6 is an extension of the diagram of the above figure to a multiple fractional phase-locked loop frequency synthesizer.

FIG. 6 shows an extension of the diagram of FIG. 5 to a multiple fractional phase-locked loop frequency synthesizer. The counter-divider 5 of the phase-locked loop has s consecutive integer ratios of division N, N+1, ■, N+s and one command for the selection of one of the division ratios connected to the output of a circuit to control an instantaneous ratio of division by means of a synchronization circuit 31 that takes account of a selected division ratio in synchronism with the overflows of the counter-divider 5.

The control circuit for the instantaneous ratio of division has a bank of s partial circuits for the implicit computation of digital accumulation and for detecting the overflows of accumulation computed, and a digital adder 40 which carries out the addition, at output, of the s overflow detection signals delivered by the bank of s partial circuits. To provide these s overflow signals, the s partial circuits of the bank, at the rate of the reference oscillator 2, carry out in parallel s operations of digital accumulation modulo s integers $P_1, P_2, \ldots, P_s$, that are relatively prime with variable integer increments $K_1, K_2, \ldots, K_s$ and detect the cycles of the reference oscillator 2 during which they overflow. Each of these partial circuits, like the circuit of FIG. 5 to control an instantaneous ratio of division, comprises a counter 60, 61, ■, 62 respectively with an increment of one, whose rate is set by the signal of the reference oscillator 2, a digital multiplier 63, 64, ■, 65 respectively taking the product of the increment by the counted value of the counter 60, 61, ■, or 62 respectively and a digital comparator 66, 67, ■, 68 respectively detecting the cycles of the reference oscillator 2 at which the product delivered by the multiplier is strictly smaller than the increment. Each partial circuit for implicit computation and detection differs from the others by the value of the modulo with which it counts the cycles of the reference oscillator and takes the product of this counted value by the value of the increment. Thus, the $i^{th}$ circuit has a counter and a modulo $P_i$ multiplier, the modulo values $P_1$, $P_2, \ldots, P_i, P_s$, being all different and relatively prime.

The complexity of the circuit of FIG. 6 is only apparent for, in most cases, the comparator and the multiplier of each partial circuit for controlling an instantaneous ratio of division can be made by means of a relatively simple combination of logic gates.

Let us take for example a coherent frequency synthesizer covering the 600 MHz to 1200 MHz band by means of a 60 MHz reference oscillator and a multiple fractional structure with the modulo values 3, 4 and 5 giving it a resolution of:

$$\frac{F_{ref}}{P_1 P_2 P_3} = 1 \text{ MHz}$$

According to the architecture of FIG. 6, this synthesizer contains three partial circuits for the implicit computation of digital accumulation and the localization of the overflows of the computed digital accumulation which carry out a parallel computation of three operations of digital accumulation modulo 3, 4 and 5 with various increments, at the rate of the reference oscillator, and detect their overflows. The binary output signals from these partial circuits are added up so that, after resynchronization, they are used to control the selection of the instantaneous ratio of division of the counter-divider of the phase-locked loop. As was seen here above, these three partial computation and localizing circuits must deliver an output binary signal corresponding to the validity or non-validity of the inequality:

[($n$ mod $P$).$K$] mod $P<K$ established for the modulo values 3, 4 and 5 and for the increment values K chosen. The study of the logic states of their output signals therefore amounts to the study of the tables of the true or false logic states taken by this inequality for each of the modulo values 3, 4 and 5 as a function firstly of the values scanned by the modulo counter of the phase memory and secondly the possible values for the increment. Now these tables show that the true or false logic states taken by the inequality meet three logic equations depending on the modulo value:

a first logic equation for the modulo 3:

MSB($n$ mod 3).LSB($K$)+$\overline{\text{LSB}(n \bmod 3)}$.MSB($K$)

a second logic equation for the modulo 4:

MSB($n$ mod 4).$\overline{\text{LSB}(n \bmod 4)}$.LSB($K$)+LSB($n$ mod 4).MSB($K$)

a third logic equation for the modulo 5:

$\overline{\text{MSB}(n \bmod 5)}$.MSB($K$)+LSB($n$ mod 5).ISB($K$)+MSB($n$ mod 5).MSB($K$)

MSB(x) being the most significant bit of x, ISB(x) being the intermediate significant bit of x assumed to be encoded on three bits, and LSB(x) being the least significant bit of x.

These three logic equations show that, in this case, the multipliers and comparators of the partial computation and localization circuits of the diagram of FIG. 6 can be obtained by means of a few logic gates.

Figure 7:
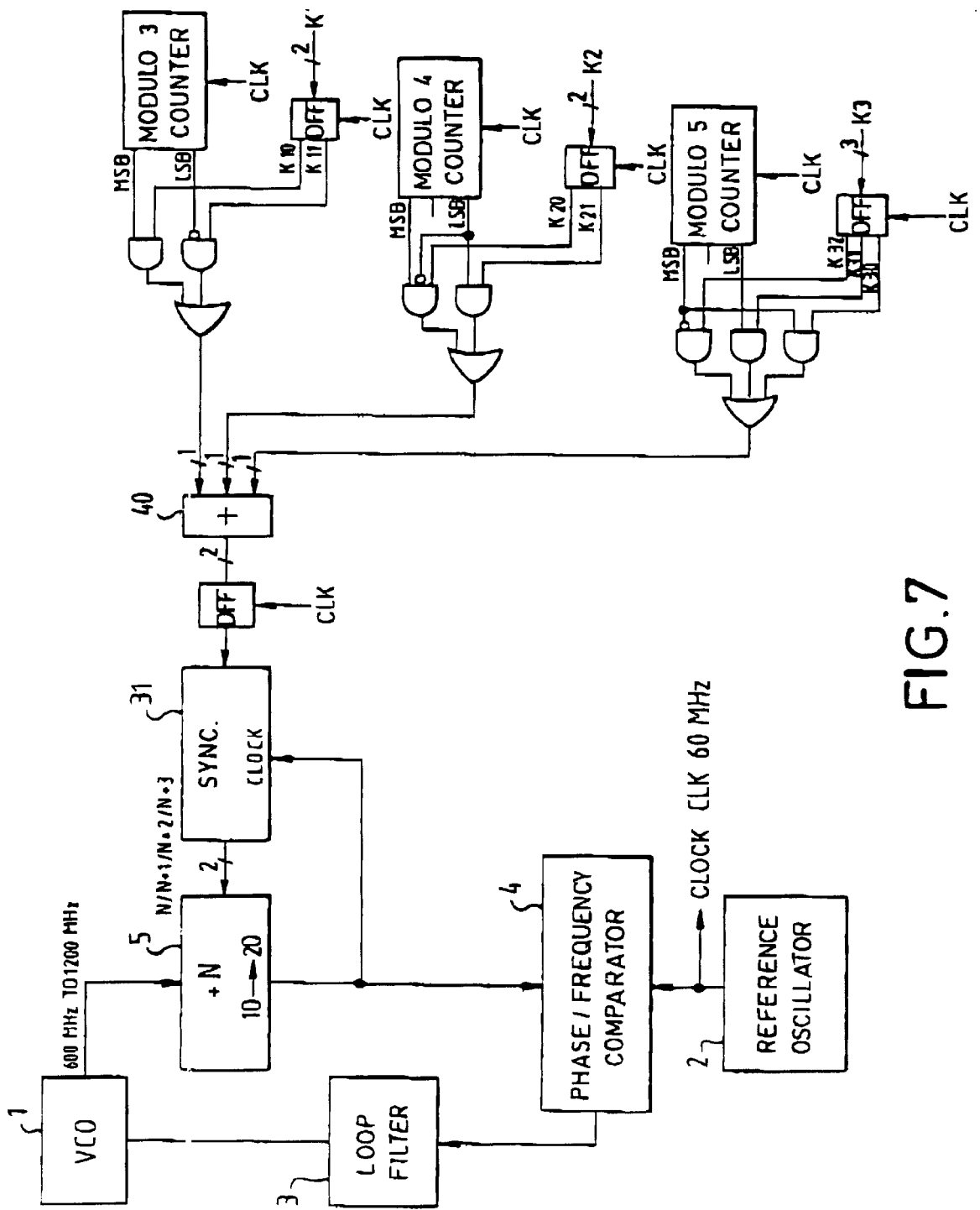
FIG. 7 is a diagram showing the simplicity of implementation of the block diagram of the above figure in a practical case.

FIG. 7 shows the relative simplicity of the diagram resulting therefrom.

What is claimed is:

1. A fractional phase-locked loop synthesizer comprising: a phase-locked loop including a loop comparator connected to receive a reference frequency from a reference oscillator at a first loop comparator input and to provide a loop comparator output, a loop filter connected to receive the loop comparator output and to provide a loop filter output, and a voltage controlled oscillator connected to receive the loop filter output and to provide a voltage controlled variable frequency loop output signal coupled to an input of a counter-divider, said counter-divider being configured to divide the loop output signal by one of at least two successive divisors N and N+1, N being an integer, and to provide divided signals at a counter-divider output to a second input of the loop comparator, said counter-divider receiving a control signal from a control circuit to select the value of the divisor being applied by the counter-divider, said control circuit having at least one modulo counter with an increment of one, said at least one modulo counter being clocked at the reference frequency and producing at least one overflow output incorporated into the control signal by the control circuit to provide phase coherency between the divided signals produced with different divisors by the counter-divider.

2. A frequency synthesizer according to claim 1, wherein said modulo counter is a modulo P counter, P being an integer, and the control circuit further includes at least one modulo P multiplier configured to receive and multiply a value counted by the at least one modulo P counter by an increment value K, K being an integer less than P, to provide a multiplier output signal, at least one comparator configured to compare the multiplier output signal received at a first input with the increment value K received at a second input and to generate at least one overflow signal whenever the multiplier output signal has a value less than the increment value K, and a synchronization circuit connected to receive the divided signals and the at least one overflow signal to synchronize the divided signals with the at least one overflow signal before applying the at least one overflow signal to the counter-divider as at least a part of the control signal.

3. A frequency synthesizer according to claim 1, wherein said modulo counter is a modulo P counter with an increment of one, P being an integer, at least one modulo P multiplier configured to receive and multiply a value counted by the at least one modulo P counter by an increment value K, K being an integer less than P, to provide a multiplier output signal, at least one comparator configured to compare the multiplier output signal received at a first input with the increment value K received at a second input and to generate at least one overflow signal whenever the multiplier output signal has a value that is greater than or equal to a difference between values of P and K and a synchronization circuit connected to receive the divided signals and the at least one overflow signal to synchronize the divided signals with the at least one overflow signal before applying the at least one overflow signal to the counter-divider as at least a part of the control signal.

4. A multiple fractional synthesizer according to claim 2 or claim 3, wherein the counter-divider is configured to divide the loop output signal with a selected one of s divisors, N, N+1, . . . , N+s, s being an integer, and the control circuit includes s partial control circuits providing s parallel operations of digital accumulation clocked at the reference frequency with s relatively prime modulo values $P_1, \ldots, P_s$ and corresponding variable integer increments having integer increment values $K_1, \ldots, K_s$, that are less than the corresponding relatively prime modulo value, the s partial control circuits providing individual overflow signals as outputs connected to corresponding inputs of a digital adder configured to combine the overflow signals to form a combined overflow output to apply to the synchronization circuit along with the divided signals, wherein each of said s partial control circuits includes an individual modulo P counter with a particular modulo value $P_s$ to supply an individual count value to an individual corresponding modulo P multiplier with the corresponding particular modulo value $P_s$ and configured to multiply the value counted by the corresponding individual modulo P counter with a corresponding increment value $K_1, \ldots, K_s$, and applying each multiplier output signal to a corresponding first input of a corresponding one of s comparators configured to compare the multiplier output signal with the corresponding increment value $K_1, \ldots K_s$ and delivering a corresponding overflow signal to the digital adder as a function of the result of the comparison.

5. A multiple fractional synthesizer according to claim 1, wherein said counter-divider performs selective division using a selected one of three successive integer divisors N, N+1, and N+2 and said control circuit includes three partial control circuits performing three parallel operations of digital accumulation with three corresponding modulo counters having relatively prime modulo values 3, 4 and 5 and with three corresponding integer increment values $K_1$, $K_2$, and $K_3$ that are less than a corresponding relatively prime modulo value, wherein outputs from each of the modulo counters having relatively prime modulo values 3, 4 and 5 and outputs associated with the three corresponding integer increment values $K_1$, $K_2$, and $K_3$ are applied to an individual combination of logic gates separately contained in each of the three partial control circuits, wherein the partial control circuit having the modulo 3 counter and outputs associated with the modulo 3 counter and with an integer increment value of $K_1$ according to a logic equation:

$$\text{MSB } (n \bmod 3).\text{LSB}(K) + \overline{\text{LSB (mod 3)}}. \text{MSB } (K)$$

and the partial control circuit having the modulo 4 counter and outputs associated with the modulo counter and an integer increment value of $K_2$ according to a logic equation:

$$\text{MSB } (n \bmod 4).\overline{\text{LSB } (n \bmod 4)}.\text{LSB}(K) + \text{LSB } (n \bmod 4). \text{ MSB } (K)$$

and the partial control circuit having the modulo 5 counter and outputs associated with the modulo 5 counter and an integer increment value of $K_3$ according to a logic equation:

$$\overline{\text{MSB } (n \bmod 5)}.\text{MSB}(K) + \text{LSB}(n \bmod 5).\text{ISB}(K) + \text{MSB } (n \bmod 5).\text{MSB } (K)$$

n being a count of a number of cycles of the reference oscillator from an arbitrary instant, K being a digital accumulation increment, MSB being a most significant bit, ISB being an intermediate significant bit when at least three bits are encoded, and LSB being a least significant bit.

6. A frequency synthesizer according to claim 1, wherein said control circuit further comprises at least one modulo P accumulator with an increment K clocked at the reference frequency, at least one K increment memory having an input receiving a write command from the overflow output of the modulo P counter and having a data read output connected to an increment input of the at least one modulo P accumulator, said at least one modulo P accumulator having at least one accumulator overflow output connected to an input of a synchronization circuit configured to synchronize at least one accumulator overflow signal at the at least one accumulator overflow output with the signals at the counter-divider output before applying the at least one accumulator overflow signal to the counter-divider as the control signal.

7. A synthesizer according to claim 6, wherein said at least one K increment memory comprises a multiplexer with a data output, an addressing input connected to the overflow output of the modulo P counter through a first D type logic flip-flop circuit clocked at the reference frequency and having two data inputs, one data input being looped to the data output through a second D type flip-flop circuit clocked at the reference frequency.

8. A synthesizer according to claim 6, wherein said at least one modulo P accumulator has a resetting control input connected to the overflow output of the modulo P counter through a D type logic flip-flop circuit clocked at the reference frequency.

9. A multiple fractional synthesizer according to claim 6, wherein the counter-divider is provided with s integer divisors N, N+1, . . . , N+s and the control circuit includes s partial circuits provided in parallel and a digital adder configured to combine s overflow signals from the s partial circuits for applying to the synchronization circuit, wherein each of said s partial circuits comprise, in common, a counter working at the rate of the reference oscillator on the basis of the product $\Pi^s_{i=1} P_i$ of the modulo values and each comprising, in particular, an individual accumulator working with a particular modulo value with a particular increment, at the frequency of the reference oscillator, and an individual increment memory that receives a write order from the overflow output of the common counter and is connected to its read output to an increment input of the individual accumulator.

* * * * *